United States Patent
Moon et al.

(10) Patent No.: US 9,135,134 B2
(45) Date of Patent: Sep. 15, 2015

(54) SEMICONDUCTOR DEVICE AND OPERATING METHOD THEREOF

(71) Applicant: SK hynix Inc., Icheon-si Gyeonggi-do (KR)

(72) Inventors: Young-Suk Moon, Icheon-si (KR); Hyung-Dong Lee, Gyeonggi-Do (KR); Yong-Kee Kwon, Seoul (KR); Hong-Sik Kim, Seongnam-si (KR)

(73) Assignee: SK Hynix Inc., Gyeonggi-do (KR)

( * ) Notice: Subject to any disclaimer, the term of this patent is extended or adjusted under 35 U.S.C. 154(b) by 255 days.

(21) Appl. No.: 13/908,733

(22) Filed: Jun. 3, 2013

(65) Prior Publication Data

US 2013/0326163 A1 Dec. 5, 2013

(30) Foreign Application Priority Data

Jun. 4, 2012 (KR) ........................ 10-2012-0060067

(51) Int. Cl.
| | |
|---|---|
| *G06F 11/00* | (2006.01) |
| *G06F 11/30* | (2006.01) |
| *G06F 12/00* | (2006.01) |
| *G06F 12/08* | (2006.01) |
| *G06F 11/07* | (2006.01) |
| *G11C 7/02* | (2006.01) |
| *G11C 11/406* | (2006.01) |
| *G11C 11/408* | (2006.01) |

(52) U.S. Cl.
CPC .......... *G06F 11/3037* (2013.01); *G06F 11/004* (2013.01); *G06F 11/073* (2013.01); *G06F 12/00* (2013.01); *G06F 12/0804* (2013.01); *G11C 7/02* (2013.01); *G11C 11/406* (2013.01); *G11C 11/408* (2013.01); *G11C 11/40603* (2013.01); *G11C 11/40618* (2013.01)

(58) Field of Classification Search
CPC . G06F 11/004; G06F 11/073; G06F 11/3037; G06F 12/00; G06F 12/0804; G11C 7/02; G11C 11/406; G11C 11/40603; G11C 11/40618; G11C 11/408
See application file for complete search history.

(56) References Cited

U.S. PATENT DOCUMENTS

| | | | |
|---|---|---|---|
| 5,777,924 A * | 7/1998 | Lee et al. ................. | 365/185.11 |
| 5,953,250 A * | 9/1999 | Hsu et al. ................. | 365/185.11 |
| 6,295,238 B1 * | 9/2001 | Tanizaki et al. ............... | 365/201 |
| 7,212,435 B2 | 5/2007 | Rudeck et al. | |
| 8,923,084 B1 * | 12/2014 | Song ............................. | 365/222 |
| 2002/0141279 A1 * | 10/2002 | Dietrich et al. ............... | 365/233 |
| 2004/0174729 A1 * | 9/2004 | Sakai et al. .................... | 365/145 |
| 2006/0198226 A1 * | 9/2006 | Takahashi et al. ............ | 365/222 |
| 2007/0255889 A1 * | 11/2007 | Yogev et al. .................. | 711/103 |
| 2008/0165605 A1 * | 7/2008 | Fisch et al. .................... | 365/222 |
| 2011/0122687 A1 * | 5/2011 | Kwon et al. ............. | 365/185.02 |
| 2013/0077392 A1 * | 3/2013 | Park et al. ..................... | 365/163 |
| 2014/0173382 A1 * | 6/2014 | Yang et al. .................... | 714/773 |
| 2014/0281766 A1 * | 9/2014 | Yang et al. .................... | 714/721 |
| 2014/0359208 A1 * | 12/2014 | Song ............................. | 711/106 |
| 2015/0043292 A1 * | 2/2015 | Lee et al. ...................... | 365/201 |

* cited by examiner

*Primary Examiner* — Joshua P Lottich
(74) *Attorney, Agent, or Firm* — William Park & Associates Ltd.

(57) ABSTRACT

A semiconductor device includes a controller configured to control a first memory device to process a request for the first memory device. The controller receives the request for the first memory device, determines a data damage risk of cells connected to one or more second signal lines adjacent to a first signal line of the first memory device corresponding to a requested address by referring to information indicating a data damage risk, and restore data in one or more cells of the cells connected to the second signal line when determining that there is the data damage risk.

20 Claims, 5 Drawing Sheets

FIG. 4

| valid | address | counter |
|---|---|---|
| valid | address | counter |
| valid | address | counter |

· · ·

| valid | address | counter |
|---|---|---|
| valid | address | counter |
| valid | address | counter |

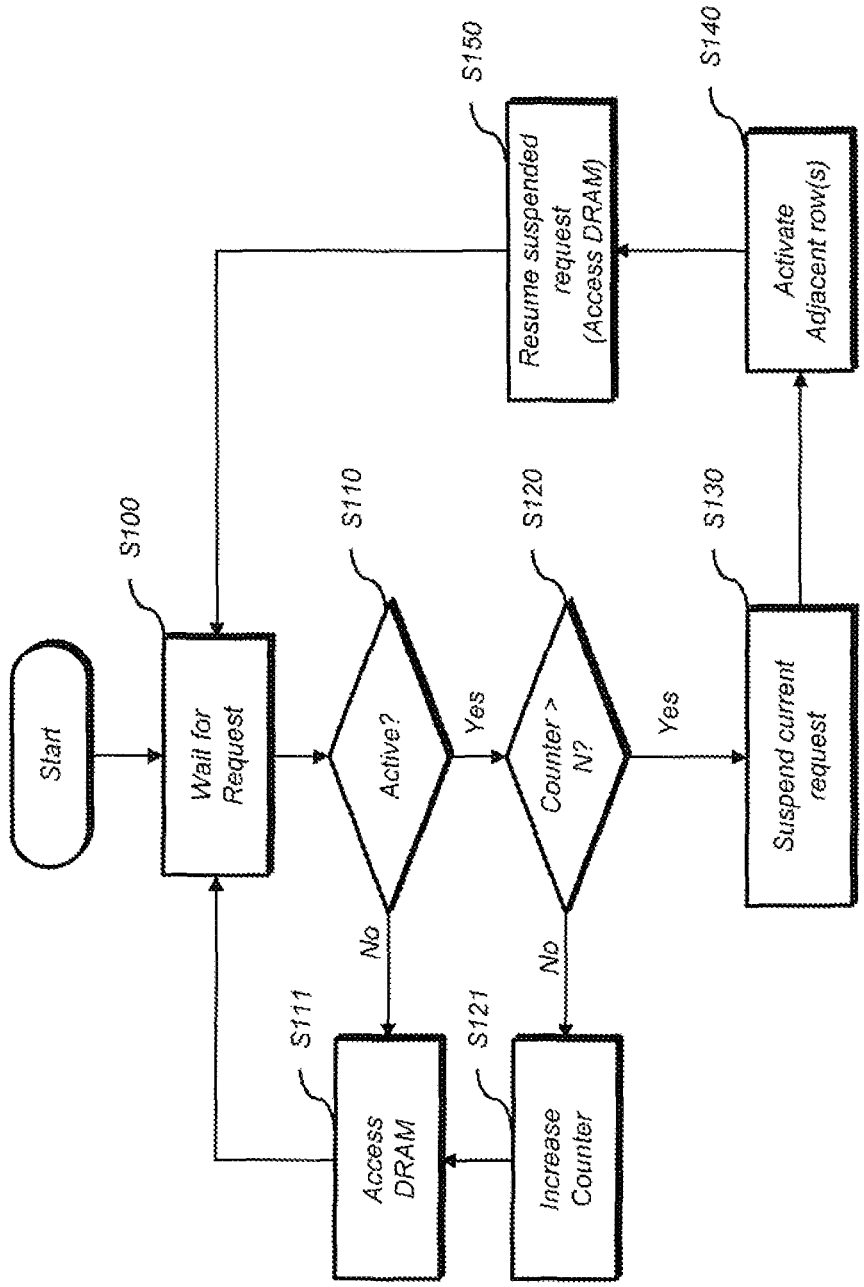

SEMICONDUCTOR DEVICE AND OPERATING METHOD THEREOF

CROSS-REFERENCE TO RELATED APPLICATIONS

The present application claims priority of Korean Patent Application No. 10-2012-0060067, filed on Jun. 4, 2012, which is incorporated herein by reference in its entirety.

BACKGROUND

1. Technical Field

Various embodiments of the present invention generally relate to a semiconductor device and an operating method thereof, and more particularly, to a semiconductor device capable of preventing data of cells from being damaged by word line disturbance of a semiconductor memory device, and an operating method thereof.

2. Related Art

A coupling effect between word lines has increased with the increase in the degree of integration implemented with a semiconductor memory device. Accordingly, when the number of operations for a word line to toggle between an activated state and a deactivated state increases, the data of cells connected to an adjacent word line may be damaged due to a coupling effect between word lines.

For example, in the case of DRAM, electromagnetic waves generated while a word line toggles introduces electrons to capacitors of cells connected to an adjacent word line or discharge electrons from the capacitors, thereby damaging data.

Such a word line disturbance issue cannot be solved through the conventional technology. For example, in the case of DRAM, the data of cells may be damaged by word line disturbance even before a refresh period. Therefore, a word line disturbance issue cannot be solved through a refresh operation.

SUMMARY

Various embodiments are directed to a semiconductor device capable of preventing the data of cells from being damaged by word line disturbance of a semiconductor memory device, and an operating method thereof.

In an embodiment, an operating method of a semiconductor device includes: receiving a request for a first memory device; determining a data damage risk of cells connected to one or more second signal lines adjacent to a first signal line of the first memory device corresponding to a requested address by referring to information indicating a data damage risk; and restoring data in one or more cells of the cells connected to the second signal line when determining that there is the data damage risk.

The operating method may further include updating the information indicating the data damage risk when determining that there is no data damage risk.

The operating method may further include suspending processing the request for the first memory device when determining that there is the data damage risk.

The operating method may further include resuming processing the request for the first memory device after the restoring of the data.

The information indicating the data damage risk may be stored in a second memory device.

The first memory device may include a volatile memory device.

The restoring of the data may include activating the second signal line.

When a refresh operation is performed on the first memory device, the information indicating the data damage risk may be invalidated.

The information indicating the data damage risk may include the number of selections for the first signal line.

In the determining of the data damage risk, when the number of selections for the first signal line exceeds a critical point, it may be determined that there is the data damage risk.

The operating method may further include increasing the number of selections for the first signal line when determining that there is no data damage risk.

The first and second signal lines may include a word line.

In an embodiment, a semiconductor device includes a controller configured to control a first memory device to process a request for the first memory device. The controller receives the request for the first memory device, determines a data damage risk of cells connected to one or more second signal lines adjacent to a first signal line of the first memory device corresponding to a requested address by referring to information indicating a data damage risk, and restore data in one or more cells of the cells connected to the second signal line when determining that there is the data damage risk.

The controller may update the information indicating the data damage risk when determining that there is no data damage risk.

The controller may suspend processing the request for the first memory device when determining that there is the data damage risk.

The controller may resume processing the request for the first memory device after restoring the data.

The semiconductor device may further include a second memory device to store the information indicating the data damage risk.

The first memory device may include a volatile memory device.

The controller may activate the second signal line to restore the data.

The controller may invalidate the information indicating the data damage risk, when a refresh operation was performed on the first memory device.

The information indicating the data damage risk may include the number of selections for the first signal line.

When the number of selections for the first signal line exceeds a critical point, the controller may determine that there is a data damage risk.

The controller may increase the number of selections for the first signal line when determining that there is no data damage risk.

The first and second signal lines may include a word line.

In an embodiment, a system includes a semiconductor memory device including a signal line and a controller to control the semiconductor memory device. The controller receives the request for the semiconductor memory device, determines a data damage risk of cells connected to one or more second signal lines adjacent to a first signal line of the semiconductor memory device corresponding to a requested address by referring to information indicating a data damage risk, and restore data in one or more cells of the cells connected to the second signal line when determining that there is the data damage risk.

The controller may update the information indicating the data damage risk when determining that there is no data damage risk.

The controller may suspend processing the request for the semiconductor memory device when determining that there is the data damage risk.

The controller may resume processing the request for the semiconductor memory device after restoring the data.

The semiconductor device may further include a first memory device to store the information indicating the data damage risk.

The semiconductor memory device may include a volatile memory device.

The controller may activate the second signal line to restore the data.

The controller may invalidate the information indicating the data damage risk, when a refresh operation was performed on the first memory device.

The information indicating the data damage risk may include the number of selections for the first signal line.

When the number of selections for the first signal line exceeds a critical point, the controller may determine that there is a data damage risk.

The controller may increase the number of selections for the first signal line when determining that there is no data damage risk.

The first and second signal lines may include a word line.

In an embodiment, an electronic device includes a semiconductor device including a row access controller and a register; and a semiconductor memory device including a memory cell array, wherein the row access controller is configured to receive a request from the semiconductor memory device and determine a data damage risk of a cell coupled to a second signal line adjacent to a first signal line of the memory cell array corresponding to a requested address by referring to information indicating a data damage risk.

In an embodiment, an electronic device includes a central processing unit including a control selector coupled with a row access controller, the row access controller being coupled to a register; and a semiconductor memory device including a memory cell array, the semiconductor memory device coupled with the control selector, wherein the row access controller is configured to receive a request from the semiconductor memory device and determine a data damage risk of a cell coupled to a second signal line adjacent to a first signal line of the memory cell array corresponding to a requested address by referring to information indicating a data damage risk, and wherein the row access controller is configured to restore data in a cell of the cell connected to the second signal line when determining that there is the data damage risk.

BRIEF DESCRIPTION OF THE DRAWINGS

FIG. 4 is a block diagram illustrating a register in accordance with the embodiments of the present invention.

FIG. 5 is a flowchart illustrating an operating method of the semiconductor device in accordance with an embodiment of the present invention.

DETAILED DESCRIPTION

Figure 1:
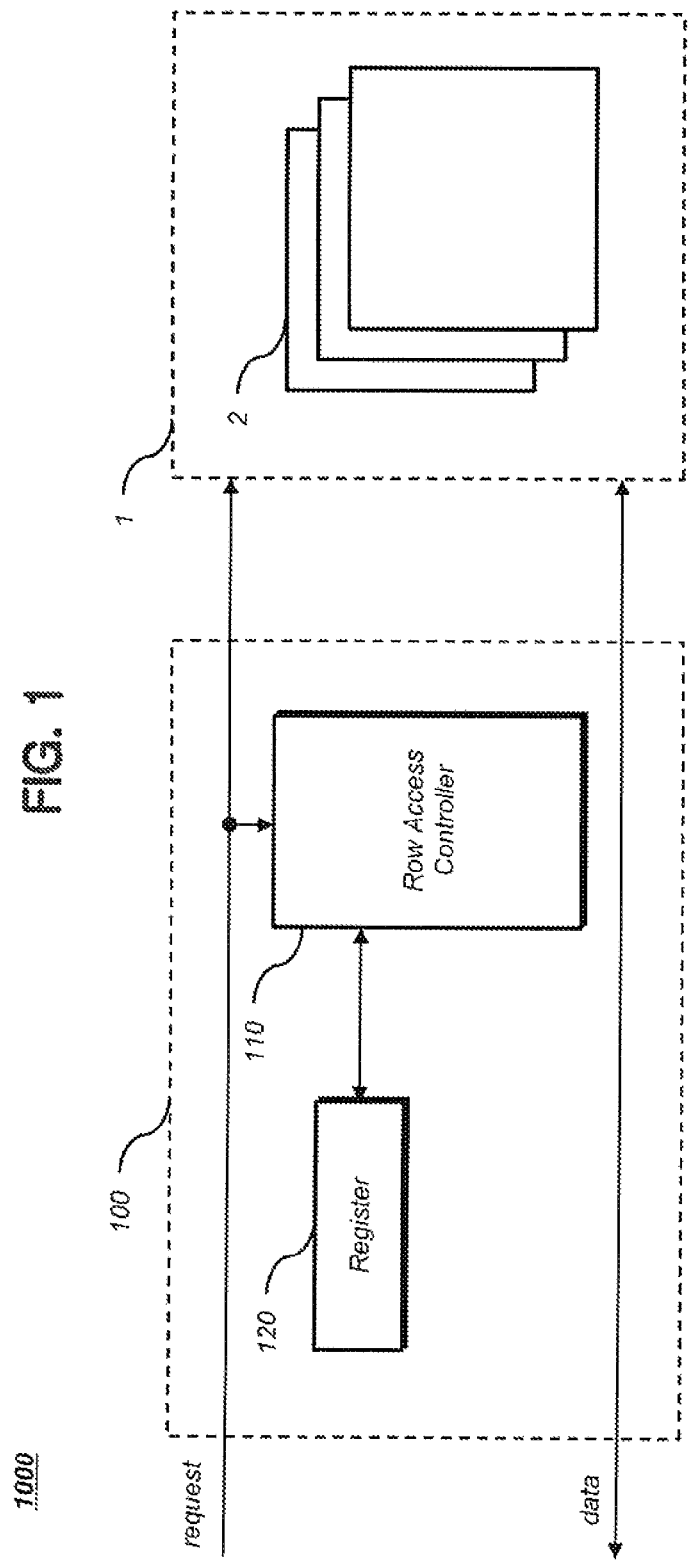
FIG. 1 is a block diagram illustrating an electronic device including a semiconductor device and semiconductor memory device in accordance with an embodiment of the present invention.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

In the embodiments of the present invention, a semiconductor memory device is a memory device having a memory cell array including word lines, and the type of the semiconductor memory device is not specified. Therefore, the semiconductor memory device may be configured with a volatile memory device such as DRAM or a nonvolatile memory device such as MRAM, STT-RAM, Flash memory, PCRAM, or ReRAM.

FIG. 1 is a block diagram illustrating an electronic device 1000 including a semiconductor device 100 and a semiconductor memory device 1 in accordance with an embodiment of the present invention.

The semiconductor device 100 in accordance with the embodiments of the present invention may be included in a controller such as a memory controller to control a semiconductor memory device 1, or may be implemented separately from the controller.

The semiconductor device 100 in accordance with the embodiments of the present invention may include a row access controller 110 and a register 120.

The row access controller 110 may be configured to receive a request for the semiconductor memory device 1 and determine whether or not there is a risk that data of cells connected to a word line adjacent to a word line within a memory cell array 2 corresponding to a requested address will be damaged (hereafter, referred to as a data damage risk), by referring to information indicating a data damage risk.

When determining that there is a data damage risk, the row access controller 110 may control the semiconductor memory device 1 to restore data of one or more of the cells connected to the adjacent word line.

In these embodiments of the present invention, how many times the word line corresponding to the requested address has been selected is checked, and whether or not the number of selections exceeds a critical point is determined, in order to determine the data damage risk. In other embodiments, the data damage risk of the cells connected to the adjacent word line may be determined according to a different criterion.

In these embodiments of the present invention, the adjacent word line may include one or two word lines next to a word line corresponding to a requested address. In other embodiments, the adjacent word line may include a plurality of word lines positioned in a predetermined range from a selected word line as well as a word line next to a word line corresponding to a request address.

For example, the adjacent word line may include eight word lines, 16 word lines, or a different number of word lines around the selected word line. In this case, the number of adjacent word lines and selection for the adjacent word lines may differ depending on an address scrambling method for the memory cell array 2.

The operation of restoring data is not limited to a specific operation. For example, when the semiconductor memory device 1 is a volatile memory device such as DRAM, the operation of restoring data may be performed by an operation of activating the adjacent word line. This operation is similar to a refresh operation limited to the adjacent word line. In other embodiments, a suitable method may be used depending on the type of the semiconductor memory device 1, in order to restore data.

In these embodiments of the present invention, an experimentally-set value may be used for the critical point serving as a comparison reference value. The critical point may have the same value regardless of the positions of word lines, and may have different values depending on the positions of word lines. Information on the critical point may be stored in the row access controller 110, the register 120, or another memory device (not illustrated).

In these embodiments of the present invention, the number of selections for a word line may be stored in the register 120. The row access controller 110 may control the register 120 so as to check the number of selections for a word line corresponding to a requested address. Furthermore, the row access controller 110 may control the register 120 to update or reset the number of selections for a word line or invalidate the number of selections for a word line.

The specific operation of the row access controller 110 will be described in detail with reference to FIG. 5.

The structure of the register 120 in accordance with the embodiments of the present invention is illustrated in FIG. 4. The register 120 may include a valid field, an address field, and a count field (i.e., counter).

In these embodiments of the present invention, the address field and the count field store a corresponding word line address (row address) within the memory cell array 2 and information on the number of selections (access number) for the corresponding word line, respectively.

The valid field stores information on whether or not the corresponding line of the register contains valid information. When new information is intended to be stored in the register 120, the valid field may be checked to select a line of which the valid field is deactivated. Furthermore, when the number of selections for a word line is intended to be checked from the register 120, an address and a count value of the word line may be searched among fields where the valid fields are activated.

Figure 2:
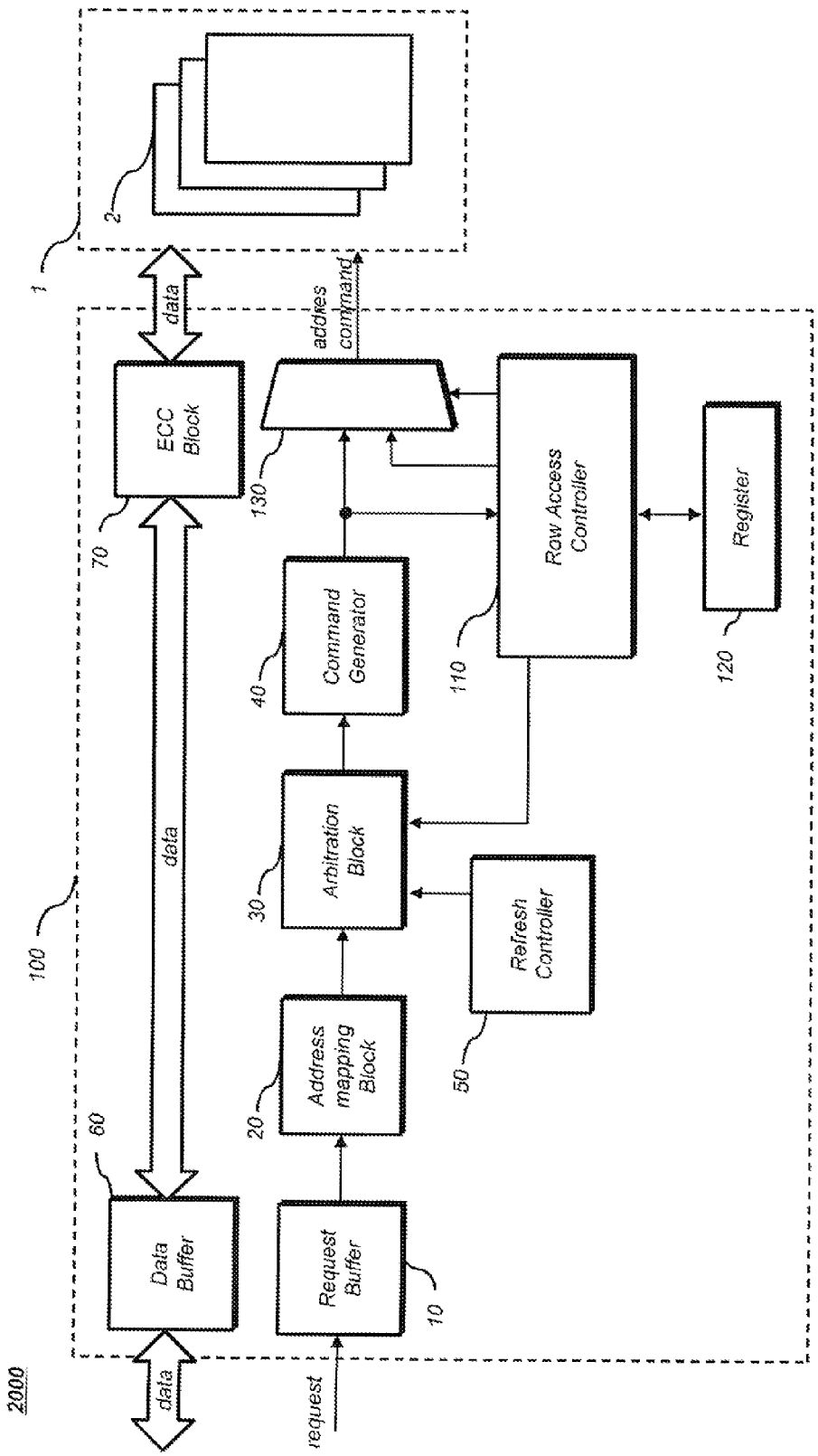
FIG. 2 is a block diagram illustrating an electronic device including a semiconductor device in accordance with an embodiment of the present invention.

FIG. 2 is a block diagram illustrating a semiconductor device 100 in accordance with an embodiment of the present invention.

In these embodiments of the present invention, the electronic device 2000 may include a semiconductor device 100 and a semiconductor memory device 1. The semiconductor device 100 may be implemented as a part of a controller to control the semiconductor memory device 1. At this time, the controller may be implemented as a memory controller or CPU, for example, but is not limited thereto.

The semiconductor device 100 in accordance with the embodiments of the present invention may include a row access controller 110, a register 120, and a control selector 130.

Furthermore, the semiconductor device 100 in accordance with the embodiments of the present invention may further include a request buffer 10, an address mapping block 20, an arbitration block 30, a command generator 40, a refresh controller 50, a data buffer 60, and an ECC block 70 (i.e., error correction code block). The request buffer 10 may be configured to temporarily store an external request. The address mapping block 20 may be configured to convert a requested address into an address of the memory cell array 2. The arbitration block 30 may be configured to set the processing sequence of a plurality of external requests when the plurality of external requests are made. The command generator 40 may be configured to generate a control command for controlling the semiconductor memory device 1 according to a request. The refresh controller 50 may be configured to control a refresh operation of the semiconductor memory device 1. The data buffer 60 may be configured to temporarily store data. The ECC block 70 may be configured to additionally store data parity in the memory cell array 2 and determine whether or not an error exists in data outputted from the memory cell array 2, through the stored parity.

The specific operations of the request buffer 10, the address mapping block 20, the arbitration block 30, the command generator 40, the refresh controller 50, the data buffer 60, and the ECC block 70 are performed in substantially the same manner as those included in a conventional memory controller. Therefore, the detailed descriptions thereof are omitted herein.

The basic operations of the row access controller 110 and the register 120 included in the semiconductor device in accordance with the embodiments of the present invention are performed in the same manner as discussed above with regards to the embodiments associated with FIG. 1 and FIG. 4.

When determining that the number of selections for a corresponding word line exceeds a critical point, the row access controller 110 temporarily suspends a current request, and restores the data of cells connected to a word line adjacent to the corresponding word line.

For this operation, the row access controller 110 may control the control selector 130 to provide a command and address generated by the row access controller 110 to the semiconductor memory device 1, instead of a control command and address generated by the command generator 40.

When the adjacent word line does not need to be activated, the row access controller 110 may control the control selector 130 to provide the control command and address outputted from the command generator 40 to the semiconductor memory device 1.

Furthermore, while the data is restored in the cells connected to the adjacent word line, the row access controller 110 may need to temporarily suspend a currently-requested command. For this operation, the row access controller 110 may provide a signal to the arbitration block 30 to suspend the current request. The row access controller 110 may provide a signal to the arbitration block 30 to resume the temporarily-suspended operation, when the activation operation for the adjacent word line is completed.

The operation of the arbitration block 30 to temporarily suspend the operation or resume the suspended operation according to a control signal while maintaining a current state may be easily implemented by those skilled in the art, and the detailed descriptions thereof are omitted herein.

Figure 3:
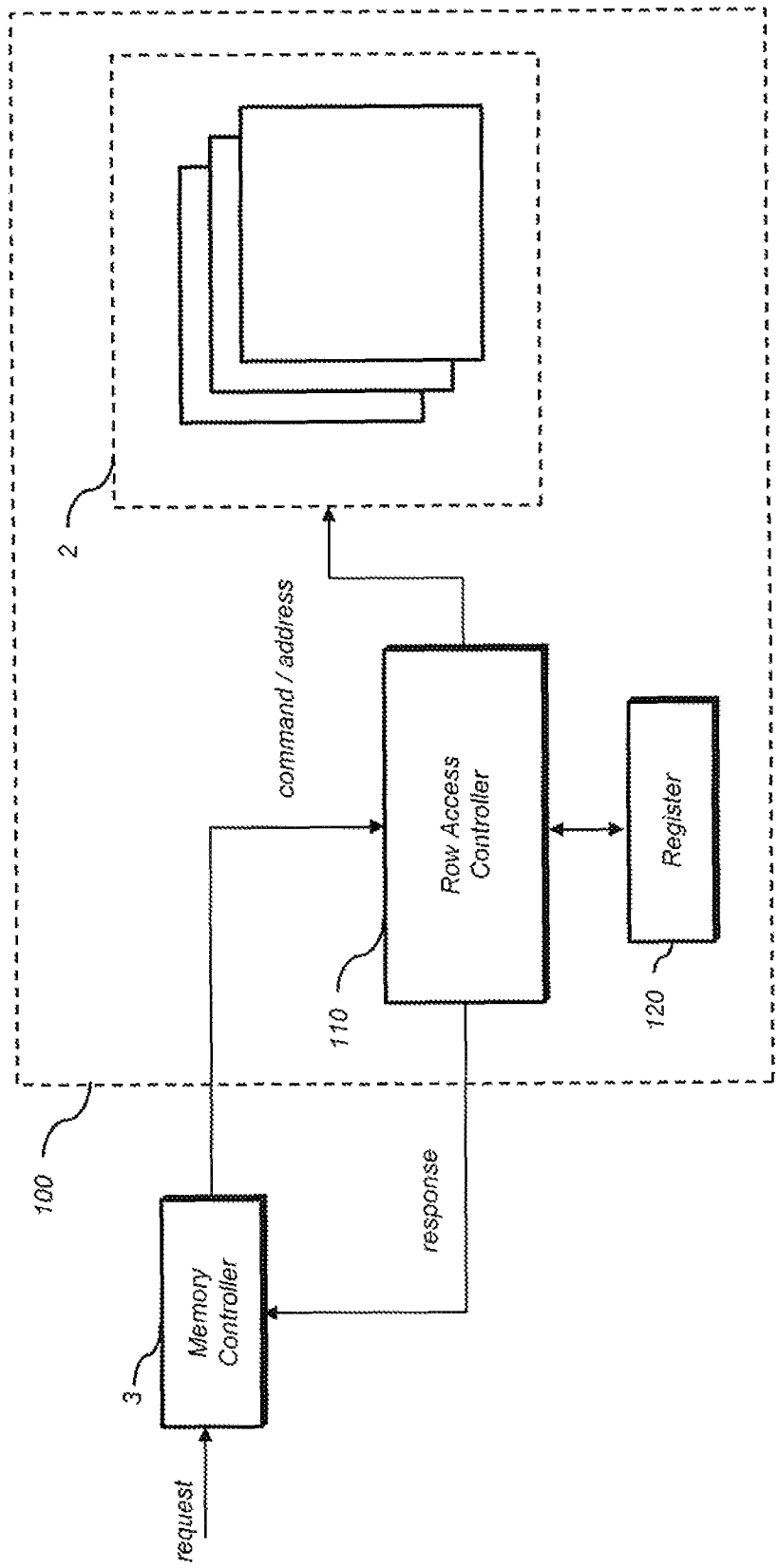
FIG. 3 is a block diagram illustrating a semiconductor device in accordance with an embodiment of the present invention.

FIG. 3 is a block diagram illustrating a semiconductor device 100 in accordance with an embodiment of the present invention.

The semiconductor device 100 in accordance with the embodiments of the present invention may include a memory cell array embedded therein. Therefore, the semiconductor device 100 in accordance with the embodiments of the present invention may be referred to as a semiconductor memory device.

Although not illustrated, the semiconductor device in accordance with the embodiments of the present invention may include components required to control general operations of the semiconductor memory device, such as an operation of inputting and outputting data to and from the memory cell array 2 or an operation of refreshing the memory cell array 2. The components are well known.

In FIG. 3, the memory controller 3 may generate a control command/address according to an external request, and may control an operation of inputting and outputting data to and from the memory cell array 2 inside the semiconductor device 100 in accordance with the embodiments of the present invention.

Since the configuration and operation of the memory controller 3 illustrated in FIG. 3 are well known, the detailed descriptions thereof are omitted. The memory controller 3 may be independently implemented, and may be included in another component such as a CPU.

The configurations and operations of the row access controller 110 and the register 120 in accordance with the embodiments of the present invention are the same as described above.

In these embodiments of the present invention, the row access controller 110 receives a command/address transmitted from the memory controller 3, controls the register 120 to check the number of selections for a word line of the memory cell array 2 corresponding to a requested address, and then compares the number of selections to a critical point.

When the number of selections exceeds the critical point, the row access controller 110 may generate a command/address for activating an adjacent word line before processing a request for the word line of the requested address, and may activate a corresponding word line within the memory cell array 2 according to the command/address. When the activation operation for the adjacent word line is completed, the row access controller 110 may process a request for a word line of the requested address.

In the above-described embodiments, the operation of determining whether or not the number of selections exceeds the critical point corresponds to an operation of determining whether or not there is a risk that cells connected to a word line corresponding to a requested address will be damaged. In other embodiments, a different method may be used.

Furthermore, the activation operation for the adjacent word line is one of the methods for restoring the data of cells connected to an adjacent word line. In other embodiments, a different method may be used.

In order to temporarily suspend a current request, the row access controller 110 may request the memory controller 3 to temporarily suspend the operation while maintaining the current request in a queue. This operation may be implemented by temporarily suspending the operation of the arbitration block 30 inside the memory controller as described with reference to FIG. 2. For this operation, the row access controller 110 may provide a response signal for requesting temporary suspension to the memory controller 3.

Then, the row access controller 110 may perform the operation of activating the adjacent word line.

Next, the row access controller 110 may request the memory controller 3 to resume the operation. This operation may be implemented by resuming the operation of the arbitration block 30 inside the memory controller as described with reference to FIG. 2. For this operation, the row access controller 110 may provide a response signal for requesting resumption to the memory controller 3.

The operation of temporarily suspending and resuming a current request may be embodied in a different manner.

In these cases, the semiconductor device 100 may not provide a response for requesting temporary suspension or resumption to the memory controller 3.

In these cases, the semiconductor device 100 may further include a buffer (not illustrated) to temporarily store a command/address received from the memory controller 3 while the activation operation for the adjacent word line is controlled.

Furthermore, the semiconductor device 100 may further include a selector (not illustrated) to selectively apply one of a command received from the memory controller 3 and a command generated from the row access controller 110 to the memory cell array 2.

At this time, the semiconductor device 100 may provide a response signal to the memory controller 3, the response signal may indicate that the request for the address requested from the memory controller 3 was completely processed. The memory controller 3 receiving the response signal may provide a command/address for the next request to the semiconductor device 100.

The time required for temporarily suspending a current request, activating the adjacent word line, and then processing the current request may differ from the time required for simply processing the current request. In these cases, a response signal may be used for normal interaction with the memory controller 3. However, when there is no problem with regards to timing, a separate response signal may not be provided to the memory controller 3.

FIG. 5 is a flowchart illustrating an operating method of the semiconductor device 100 in accordance with an embodiment of the present invention.

The control operation is performed by the row access controller 110, and the row access controller 110 may control the register 120 to perform operations.

When there is no request, the memory controller 3 waits for a request at step S100. In the embodiments illustrated in FIG. 3, the row access controller 110 waits for a command from the memory controller 3 that first received an external request.

The row access controller 110 determines whether or not a command corresponding to the received request is a command for activating a word line, at step S110 (i.e., Active?). In the embodiments of the present invention, a toggling operation in which a word line is activated and deactivated may be sensed.

Therefore, when the command is not an activation command (i.e., No) to change a word line from a deactivated state to an activated state, access to the memory cell array 2 is performed at step S111 (i.e., Access DRAM).

In other embodiments, a command to change a word line from an activated state to a deactivated state may be sensed instead of the command to change a word line from a deactivated state to an activated state.

In other embodiments, the command to change a word line from a deactivated state to an activated state or the command to change a word line from an activated state to a deactivated state may be sensed.

In each case, the value of a critical point N serving as a comparison reference at the following step S120 may differ.

At the step S120, the row access controller 110 may determine whether or not the number of selections for a word line of the memory cell array 2 corresponding to the requested address (word line address, row address) exceeds the critical point N or a predetermined amount of selections or requests for a word line of the memory cell array 2 corresponding to the requested address (i.e., Counter>N). As described above, this operation is one example for determining a data damage risk of cells connected to a word line adjacent to the corresponding word line.

Although not illustrated, when the requested address information does not exist in the register 120, the row access controller 110 may control the register 120 to add the requested address. At this time, a valid field of the updated line is activated, and the count value may be reset to 1.

When the number of selections does not exceed the critical point, the row access controller 110 controls the register 120 to increase the number of selections at step S121 (i.e., Increase Counter), and access to the memory cell array 2 is performed at step S111.

When the selection number exceeds the critical point (i.e., Yes), the row access controller 110 temporarily suspends a current request for a word line of the memory cell array 2 corresponding to the requested address at step S130, and activates a word line adjacent to the corresponding word line at step S140 (i.e., Activate Adjacent row(s)).

In these embodiments of the present invention, the adjacent word line may include one or two word lines next to a word line corresponding to a requested address. In other embodiments, the adjacent word line may include a plurality of word lines positioned in a predetermined range from a selected word line as well as a next word line. For example, the adjacent word line may include eight, 16, or a different number of word lines around the selected word line. In these cases, the number of adjacent word lines to be activated may differ depending on an addressing method for the memory cell array 2.

In the embodiments illustrated in FIG. 2, the step S130 of temporarily suspending a current request may be performed as the row access controller 110 temporarily suspends the operation of the arbitration block 30.

At the step S140, the operation of activating the adjacent word line (i.e., Activate Adjacent row(s)) may include an operation of restoring the data of cells connected to the adjacent word line. For example, in the case of DRAM, the step S140 may be understood as an operation of refreshing the adjacent word line.

After the step S140 of activating the adjacent word line, the temporarily-suspended current request may be processed at step S150 (i.e., Resume suspended request (Access DRAM)).

In other embodiments, however, the temporarily-suspended request may not be processed after the step S140, but may be maintained in a queue storing requests so as to be processed at step S111 of the next loop.

Although not illustrated, the row access controller 110 may control the register 120 to reset the count value for the requested address to 0, after the step S140 of activating the adjacent word line.

In other embodiments, the row access controller 110 may deactivate the value of the valid field to invalidate the number of selections for the corresponding word line. In these cases, when a request for the corresponding address is inputted again, information on the corresponding address may be registered in the register 120.

Furthermore, when the semiconductor memory device 1 is a volatile memory device such as DRAM, a refresh operation may be performed on a part of or on the entire memory cell array 2 at a constant interval.

When the refresh operation is performed, the entire data of the corresponding part may be restored to reset a word line disturbance effect. Therefore, the count value of the register 120 corresponding to a word line included in the refreshed region may be reset or invalidated. The invalidated register line may be reused to receive another value.

In accordance with the embodiments of the present invention, the semiconductor device and the operating method thereof may prevent word line disturbance from occurring in a semiconductor memory device.

Although various embodiments have been described for illustrative purposes, it will be apparent to those skilled in the art that various changes and modifications may be made without departing from the spirit and scope of the invention as defined in the following claims.

What is claimed is:

1. A semiconductor device comprising a controller configured to control a first memory device to process a request for the first memory device,
wherein the controller receives the request for the first memory device, determines a data damage risk of cells connected to one or more second signal lines adjacent to a first signal line of the first memory device corresponding to a requested address by referring to information indicating a data damage risk, and restore data in one or more cells of the cells connected to the second signal line when determining that there is a data damage risk.

2. The semiconductor device of claim 1, wherein the controller updates the information indicating a data damage risk when determining that there is no data damage risk.

3. The semiconductor device of claim 1, wherein the controller suspends processing the request for the first memory device when determining that there is a data damage risk.

4. The semiconductor device of claim 3, wherein the controller resumes processing the request for the first memory device after restoring the data.

5. The semiconductor device of claim 1, further comprising a second memory device to store the information indicating a data damage risk.

6. The semiconductor device of claim 1, wherein the first memory device comprises a volatile memory device.

7. The semiconductor device of claim 6, wherein the controller activates the second signal line to restore the data.

8. The semiconductor device of claim 6, wherein the controller invalidates the information indicating a data damage risk, when a refresh operation was performed on the first memory device.

9. The semiconductor device of claim 1, wherein the information indicating a data damage risk comprises a number of selections for the first signal line.

10. The semiconductor device of claim 9, wherein when the number of selections for the first signal line exceeds a critical point, the controller determines that there is a data damage risk.

11. The semiconductor device of claim 9, wherein the controller increases the number of selections for the first signal line when determining that there is no data damage risk.

12. The semiconductor device of claim 1, wherein the first and second signal lines comprise a word line.

13. An electronic device comprising:
a semiconductor device including a row access controller and a register; and
a semiconductor memory device including a memory cell array,
wherein the row access controller is configured to receive a request from the semiconductor memory device and determine a data damage risk of a cell coupled to a second signal line adjacent to a first signal line of the memory cell array corresponding to a requested address by referring to information indicating a data damage risk.

14. The electronic device of claim 13, wherein the row access controller is configured to restore data in a cell of the cell connected to the second signal line when determining that there is a data damage risk.

15. The electronic device of claim 13, wherein the first signal line corresponds to a requested address and the second signal line is positioned a predetermined range from the first signal line.

16. The electronic device of claim 15, wherein the first and second signal lines comprise word lines.

17. The electronic device of claim 13, wherein the information indicating a data damage risk includes information on how many times the first signal line has been requested and whether or not the number of requests exceeds a predetermined amount of requests.

18. An electronic device comprising:
a central processing unit including a control selector coupled with a row access controller, the row access controller being coupled to a register; and
a semiconductor memory device including a memory cell array, the semiconductor memory device coupled with the control selector,
wherein the row access controller is configured to receive a request from the semiconductor memory device and determine a data damage risk of a cell coupled to a second signal line adjacent to a first signal line of the memory cell array corresponding to a requested address by referring to information indicating a data damage risk, and
wherein the row access controller is configured to restore data in the cell coupled to the second signal line when determining that there is a data damage risk.

19. The electronic device of claim 18, wherein the first signal line corresponds to a requested address and the second signal line is positioned a predetermined range from the first signal line.

20. The electronic device of claim 18, wherein the information indicating a data damage risk includes information on how many times the first signal line has been requested and whether or not the number of requests exceeds a predetermined amount of requests.

* * * * *